United States Patent [19]
O'Kane et al.

[11] Patent Number: 5,946,169
[45] Date of Patent: Aug. 31, 1999

[54] SOFT ADJACENT LAYER VERTICALLY BIASED MAGNETORESISTIVE SENSOR HAVING IMPROVED SENSOR STABILITY

[75] Inventors: William J. O'Kane, Derry, United Kingdom; Gregory S. Mowry, Burnsville; Todd G. Backer, Apple Valley, both of Minn.; Herman C. Kluge, Santa Maria, Calif.

[73] Assignee: Seagate Technology, Inc., Scotts Valley, Calif.

[21] Appl. No.: 08/949,948

[22] Filed: Oct. 13, 1997

Related U.S. Application Data
[60] Provisional application No. 60/030,229, Nov. 7, 1996, abandoned.

[51] Int. Cl.$^6$ .................................................. G11B 5/39
[52] U.S. Cl. ............................................................. 360/113
[58] Field of Search ........................... 360/113; 324/252, 324/207.21; 338/32 R

[56] References Cited

U.S. PATENT DOCUMENTS

| | | | |
|---|---|---|---|
| 4,623,867 | 11/1986 | Lundquist et al. | 338/32 R |
| 4,843,505 | 6/1989 | Mowry | 360/113 |
| 4,967,298 | 10/1990 | Mowry | 360/113 |
| 4,972,284 | 11/1990 | Smith et al. | 360/113 |
| 4,987,508 | 1/1991 | Smith | 360/113 |
| 5,018,037 | 5/1991 | Krounbi et al. | 360/113 |
| 5,055,786 | 10/1991 | Wakatsuki et al. | 324/252 |
| 5,079,035 | 1/1992 | Krounbi | 427/130 |
| 5,285,339 | 2/1994 | Chen et al. | 360/113 |
| 5,351,003 | 9/1994 | Bauer et al. | 324/207 |
| 5,381,291 | 1/1995 | Madsen et al. | 360/113 |
| 5,402,292 | 3/1995 | Komoda et al. | 360/113 |
| 5,412,524 | 5/1995 | Nagata et al. | 360/113 |
| 5,428,491 | 6/1995 | Smith | 360/113 |
| 5,485,334 | 1/1996 | Nix et al. | 360/113 |
| 5,532,584 | 7/1996 | Jeffers et al. | 342/202 |
| 5,532,892 | 7/1996 | Nix et al. | 360/113 |
| 5,552,589 | 9/1996 | Smith et al. | 235/449 |
| 5,573,809 | 11/1996 | Nix et al. | 427/123 |
| 5,682,284 | 10/1997 | George | 360/113 |
| 5,737,156 | 4/1998 | Bonyhard | 360/113 |

OTHER PUBLICATIONS

John C. Mallinson, "The Anisotropic Magneto–Resistive Effect", *Magneto–resistive heads*, Academic Press, 1996, ISBN 0–12–466630–2, Chapter 4, pp. 25–56.

U.S. Patent Application Serial No. 08/667,276, Bonyhard, filed Jun. 20, 1996, and entitled, "Barberpole MR Sensor Having Interleaved Permanent Magnet and Magnetoresistive Segments".

*Primary Examiner*—Robert S. Tupper
*Attorney, Agent, or Firm*—Westman, Champlin & Kelly, P.A.

[57] ABSTRACT

A soft adjacent layer (SAL) vertically biased magnetoresistive (MR) sensor is disclosed. The SAL biased sensor includes at least three permanent magnet (PM) tabs (hereafter referred to as tabs). An MR sensor layer is disposed in relation to the tabs such that each of the tabs is spaced apart along a width of the MR sensor layer such that each of the tabs is in electrical and magnetic contact with the MR sensor layer to thereby stabilize the MR sensor layer. Preferably, a SAL is disposed in relation to the tabs such that each of the tabs is also spaced apart along a width of the SAL such that each of the tabs is in electrical and magnetic contact with the SAL. A spacer layer is formed between the MR sensor layer and the SAL.

16 Claims, 1 Drawing Sheet

SOFT ADJACENT LAYER VERTICALLY BIASED MAGNETORESISTIVE SENSOR HAVING IMPROVED SENSOR STABILITY

This application is based upon Provisional application Ser. No. 60/030,229 filed on Nov. 11, 1996 now abandoned, entitled "SEGMENTED PERMANENT MAGNET STRUCTURES FOR INCREASED MAGNETO-RESISTIVE SENSOR STABILITY".

The present invention relates generally to magnetoresistive (MR) sensors having soft adjacent layer (SAL) vertical biasing. More particularly, the present invention relates to an MR sensor having an improved SAL and permanent magnet (PM) configuration.

In recent years, thin film recording head research and manufacturing advances have concentrated on the manufacture of stable MR reader sensors for reading back the data recorded onto a magnetic media. Early attempts to stabilize the reader or MR element (MRE) used shape anisotropy such that when the sensor was machined into its final dimensions, its shape was conducive to maintaining a single domain configuration. However, this method alone has since been found to be an insufficient mechanism for ensuring that the sensor will either remain in a single domain state at all times during operation or recover to a single to domain state after exposure to stray fields during operation.

As a result, several domain stabilization methods have been devised to ensure increased reader stability. These methods include external permanent magnets (PMs), abutted PM devices, and exchange coupling mechanisms. All of these methods work by applying an "external" uniform magnetic field across the entire sensor region in an attempt to maintain a single domain state.

Most of the above-mentioned domain stabilization techniques are pertinent to the manufacture of thin film head MR sensors for rigid disc applications where the track-width is on the order of 1–5 µm. However, MR sensors are also becoming an integral part of tape drives which typically have much larger track-widths, on the order of 20–100 µm. In these devices, the above-mentioned stability mechanisms are much less effective because of the larger area over which they have to maintain a magnetic field capable of maintaining the sensor in a single domain. In addition, the transition between recorded bits on magnetic recorded tape is much less uniform than the corresponding transition on disc media with the result being that a much less uniform magnetic field is applied to the sensor. Therefore, the MR sensor can often be prone to decreased stability. Consequently, a SAL vertical bias type MR sensor having improved domain stability at larger MR sensor track-widths would be a significant improvement in the art.

SUMMARY OF THE INVENTION

A soft adjacent layer (SAL) vertically biased magnetoresistive (MR) sensor is disclosed. The SAL biased sensor includes at least three permanent magnet (PM) tabs (hereafter referred to as tabs). An MR sensor layer is disposed in relation to the tabs such that each of the tabs is spaced apart along a width of the MR sensor layer such that each of the tabs is in electrical and magnetic contact with the MR sensor layer to thereby stabilize the MR sensor layer. Preferably, a SAL is disposed in relation to the tabs such that each of the tabs is also spaced apart along a width of the SAL such that each of the tabs is in electrical and magnetic contact with the SAL. A spacer layer is formed between the MR sensor layer and the SAL.

DETAILED DESCRIPTION OF THE PREFERRED EMBODIMENTS

The present invention includes MR sensors for tape applications, having SAL vertical biasing, in which the MR sensor layer is stabilized with PMs spaced periodically along the sensor's length. In the MR sensors of the present invention, it is important that the PMs inserted along the MR sensor layer's length be both in electrical and magnetic contact with the MR sensor layer. Further, in some preferred embodiments, it is important that the PMs be in electrical and magnetic contact with the SAL as well.

Figure 1:
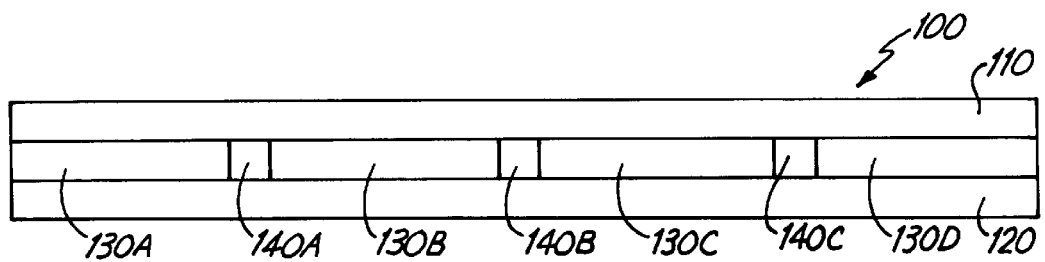
FIG. 1 is a diagrammatic view illustrating layers of a SAL vertically biased MR sensor in accordance with first preferred embodiments of the present invention.

FIG. 1 illustrates some of the layers of MR sensor 100 in accordance with first embodiments of the present invention. While not all of the layers of MR sensor 100 are necessarily shown, the layers shown in FIG. 1 are included to demonstrate important aspects of the present invention. In order to simplify the illustration of the present invention, other well known features such as gap layers and contact layers are not shown.

MR sensor 100 includes MR sensor layer 110, SAL 120, insulator or spacer layer 130 (divided into spacer layer segments 130A, 130B, 130C and 130D), and PM tabs 140A, 140B and 140C. The fabrication of MR sensor 100, as well as MR sensors 200 and 300 illustrated in FIGS. 2 and 3, can be accomplished using known fabrication techniques which are well known to those skilled in the art.

MR sensor layer 110 is preferably a layer NiFe. However, other MRE materials can be used. For example, MR sensor layer 110 can be a layer of NiFeCo. The thickness of MR sensor layer 110 in one preferred embodiment is between about 200 Å and about 400 Å, but other thickness can be used as well.

SAL 120 is preferably a layer of NiFeRh having a thickness of between about 200 Å and about 400 Å. However, other well know SAL vertical bias layer materials can be used. For example, SAL 120 can be AlFeSil (SENDUST), NiFeCr and NiFeRe.

Spacer layer segments 130A–130D are preferably formed from Ta. However, other known insulating or spacer materials commonly used with SAL vertical biasing can be substituted. Finally, PM segments 140A–140C are preferably CoPt and preferably have a thickness which is substantially equal to that of the spacer layer segments. However, other well known PM materials, such as CoCrPt, can be used.

As illustrated in FIG. 1, the spacer layer segments (generically referred to as spacer layer 130) are deposited on top of SAL 120, and MR sensor layer 110 is deposited on top of spacer layer 130. Unlike conventional MR sensors having SAL vertical biasing, PM segments 140A–140C are disposed in a spaced apart fashion between adjacent spacer layer segments, and in both electrical and magnetic contact with each of MR sensor layer 110 and SAL 120. PM segment 140A is positioned in electrical and magnetic contact with each of layers 110 and 120 while separating spacer layer segment 130A from spacer layer segment 130B. Likewise, PM segment 140B is positioned in electrical and magnetic contact with each of layers 110 and 120, while separating spacer layer segments 130B and 130C. PM segment 140C is formed in electrical and magnetic contact with each of layers 110 and 120, while separating spacer layer segments 130C and 130D. While three PM segments or tabs are shown, more or less can be used.

The frequency of (i.e. distance between) the PM segments, as well as the size of the PM segments, is important not only in ensuring an adequate structure to enhance stability, but also to minimize the loss of amplitude during read-back of a recorded signal associated with the non-active regions or dead zones in the MR sensor layer 110 created by the PM segments. In one preferred embodiment, a spacing from one PM segment or tab to the next is about 20 μm. However, other spacings can be used for particular applications.

Figure 2:
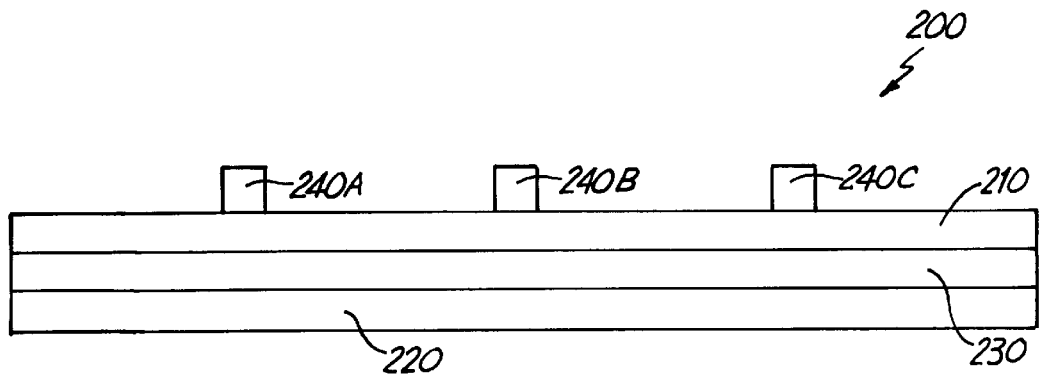
FIG. 2 is a diagrammatic view illustrating layers of a SAL vertically biased MR sensor in accordance with second preferred embodiments of the present invention.

FIG. 2 illustrates an alternate embodiment of a SAL vertically biased MR sensor in accordance with preferred embodiments of the present invention. MR sensor 200 includes MR sensor layer 210, SAL 220 and spacer layer 230. The preferred materials and thicknesses of layers 210, 220 and 230 are the same as those discussed above with reference to MR sensor 100. Like conventional SAL vertically biased MR sensors, sensor 200 has MR sensor layer 210 and SAL 220 separated by spacer layer 230. However, unlike conventional SAL vertically biased MR sensors, sensor 200 includes PM segments or tabs 240A, 240B and 240C spaced apart along the length of MR sensor layer 210. In this particular embodiment, PM segments 240A–240C are deposited directly on top of MR sensor layer 210 such that they are in electrical and magnetic contact with MR sensor layer 210 in order to stabilize the MR sensor layer via both electromagnetic coupling and PM magnetic field biasing. The spacing and thickness of PM segments 240A–240C can be the same as discussed above with reference to FIG. 1.

Figure 3:
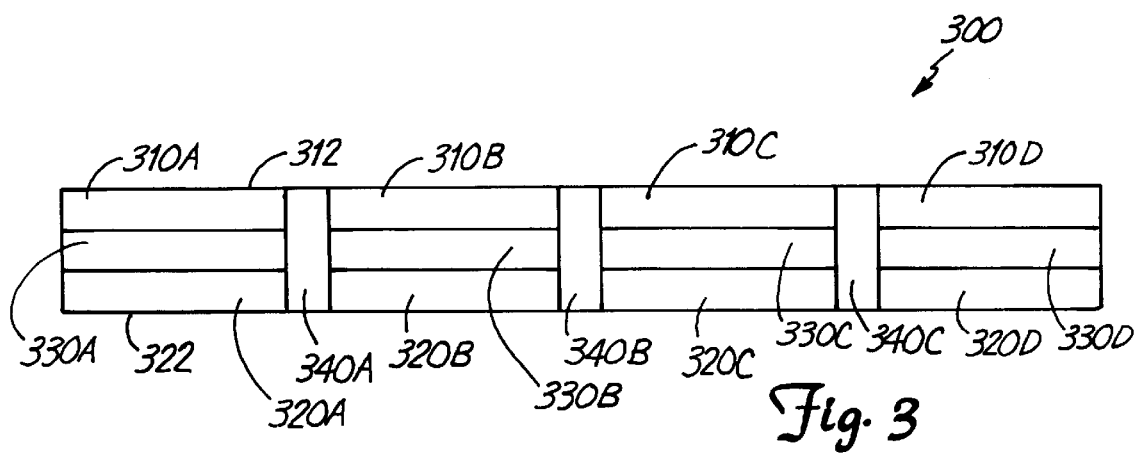
FIG. 3 is a diagrammatic view illustrating layers of a SAL vertically biased MR sensor in accordance with third preferred embodiments of the present invention.

FIG. 3 is a diagrammatic illustration of SAL vertically biased MR sensor 300 in accordance with other embodiments of the present invention. The MR sensor 300 includes MR sensor layer 310, SAL 320, spacer layer 330 and PM segments or tabs 340. In the embodiment illustrated in FIG. 3, the PM segments 340 are divided into three vertically extending PM segments 340A, 340B and 340C. The three PM segments 340A–340C extend from a first or top surface 312 of MR sensor layer 310 to a second or bottom surface 322 of SAL 320. Thus, PM segments 340A–340C divide MR sensor layer 310, SAL 320 and spacer layer 330 into four smaller sensor regions, each having a tri-layer including a magnetoresistive sensor segment, a spacer segment and a SAL segment. As such, MR sensor layer 310 is divided into MR sensor layer segments 310A, 310B, 310C and 310D. SAL 320 is divided into SAL segments 320A–320D. Spacer layer 330 is divided into spacer layer segments 330A–330D.

MR sensor layer segments 310A and 310B, SAL segments 320A and 320B and spacer layer segments 330A and 330B are separated by vertically oriented PM segment 340A. MR sensor layer segments 310B and 310C, SAL segments 320B and 320C and spacer layer segments 330B and 330C are separated by vertically oriented PM segment 340B. Finally, MR sensor layer segments 310C and 310D, SAL segments 320C and 320D, and spacer layer segments 330C and 330D are separated by vertically oriented PM segment 340C.

As with MR sensor 100 illustrated in FIG. 1, it is an important feature of preferred embodiments of the present invention that the PM segments be in both electrical and magnetic contact with both the corresponding MR sensor layer segments and the corresponding SAL segments. This feature of the present invention is very significant in that it provides sensor layer stability from electromagnetic coupling, as well as from PM magnetic fields.

The combined SAL and PM configurations of the present invention are particularly suited for use in tape applications to stabilize extremely wide MR sensors. For example, the present invention has been used to stabilize an MR reader having a width of approximately 78 μm. By spacing PM segments along the width of the MR sensor layer, while establishing both electrical and magnetic contact between the MR sensor layer and the PM segments, the net effect is the creation of a number of smaller sensors, each of which is stabilized individually by the PMs and the SAL. The loss in amplitude is expected to be minimal, as the decrease in the size of the active region caused by the inclusion of the PM segments is less than about 15%. In addition, the output of MR sensors for tape applications is typically 2–4 times that of the output in rigid disc applications. This is more than adequate for reading back recorded data. As the reader output is governed largely by the track-width of the sensor, the loss in output due to these PM insertions as track-widths decrease will become less important because the frequency of the PM insertions can be decreased and eventually removed below a certain track-width (for example around 5 μm).

Although the present invention has been described with reference to preferred embodiments, workers skilled in the art will recognize that changes may be made in form and detail without departing from the spirit and scope of the invention.

What is claimed is:

1. A soft adjacent layer vertically biased magnetoresistive sensor comprising:

at least three permanent magnet tabs;

a magnetoresistive sensor layer disposed in relation to the at least three permanent magnet tabs such that each of the at least three permanent magnet tabs is spaced apart along a width of the magnetoresistive sensor layer such that each of the at least three permanent magnet tabs is in electrical and magnetic contact with the magnetoresistive sensor layer to thereby stabilize the magnetoresistive sensor layer;

a soft adjacent layer disposed in relation to the at least three permanent magnet tabs such that each of the at least three permanent magnet tabs is spaced apart along a width of the soft adjacent layer such that each of the at least three permanent magnet tabs is in electrical and magnetic contact with the soft adjacent layer; and a spacer layer formed between the magnetoresistive sensor layer and the soft adjacent layer.

2. The soft adjacent layer vertically biased magnetoresistive sensor of claim 1, wherein the at least three permanent magnet tabs are formed coplanar with the spacer layer in a spaced apart fashion such that the at least three permanent magnet tabs and the spacer layer have substantially the same thickness and such that the at least three permanent magnet tabs divide the spacer layer into at least four spacer layer segments with one of the at least three permanent magnet tabs positioned between each two adjacent spacer layer segments.

3. The soft adjacent layer vertically biased magnetoresistive sensor of claim 2, wherein all of the at least four spacer layer segments have substantially the same width.

4. The soft adjacent layer vertically biased magnetoresistive sensor of claim 1, wherein the at least three permanent magnet tabs are formed in a spaced apart fashion such that each of the at least three permanent magnet tabs extends longitudinally between the magnetoresistive sensor layer and the soft adjacent layer to thereby divide each of the magnetoresistive sensor layer, the spacer layer and the soft adjacent layer into at least four separated and non-contacting segments.

5. The soft adjacent layer vertically biased magnetoresistive sensor of claim 4, wherein each of the at least three permanent magnet tabs extends longitudinally between the magnetoresistive sensor layer and the soft adjacent layer a distance which is substantially equal to a combined thickness of the magnetoresistive sensor layer, the spacer layer and the soft adjacent layer.

6. The soft adjacent layer vertically biased magnetoresistive sensor of claim 5, wherein the at least three permanent magnet tabs divide the magnetoresistive sensor layer, the spacer layer and the soft adjacent layer into at least four tri-layered segments, wherein each of the at least four tri-layered segments includes a spacer layer segment positioned between a magnetoresistive sensor layer segment and a soft adjacent layer segment.

7. The soft adjacent layer vertically biased magnetoresistive sensor of claim 6, wherein all of the at least four tri-layered segments have substantially equal widths.

8. A magnetoresistive sensor comprising:

a magnetoresistive sensor layer;

a plurality of at least three permanent magnets disposed in spaced apart contact with the magnetoresistive sensor layer along the width of the magnetoresistive sensor layer, wherein each of the plurality of permanent magnets is in electrical and magnetic contact with the magnetoresistive sensor layer to thereby stabilize the magnetoresistive sensor layer;

a soft adjacent layer; and a spacer layer formed between the magnetoresistive sensor layer and the soft adjacent layer.

9. The magnetoresistive sensor of claim 8, wherein each of the plurality of permanent magnets is also disposed in spaced apart contact along the width of the soft adjacent layer such that each of the plurality of permanent magnets is in electrical and magnetic contact with the soft adjacent layer.

10. The magnetoresistive sensor of claim 9, wherein the plurality of permanent magnets are formed coplanar with the spacer layer in a spaced apart fashion such the plurality of permanent magnets and the spacer layer have substantially the same thickness and such that the plurality of permanent magnets divide the spacer layer into a plurality of spacer layer segments with one of the plurality of permanent magnets positioned between each two adjacent ones of the plurality of spacer layer segments.

11. The magnetoresistive sensor of claim 10, wherein all of the plurality of spacer layer segments have substantially the same width.

12. The magnetoresistive sensor of claim 9, wherein the plurality of permanent magnets are formed in a spaced apart fashion such that each of the plurality of permanent magnets extends longitudinally between the magnetoresistive sensor layer and the soft adjacent layer to thereby divide each of the magnetoresistive sensor layer, the spacer layer and the soft adjacent layer into a plurality of separated and non-contacting segments.

13. The magnetoresistive sensor of claim 12, wherein each of the plurality of permanent magnets extends longitudinally between the magnetoresistive sensor layer and the soft adjacent layer a distance which is substantially equal to a combined thickness of the magnetoresistive sensor layer, the spacer layer and the soft adjacent layer.

14. The magnetoresistive sensor of claim 13, wherein the plurality of permanent magnets divide the magnetoresistive sensor layer, the spacer layer and the soft adjacent layer into a plurality of tri-layered segments, wherein each of the plurality of tri-layered segments includes a spacer layer segment positioned between a magnetoresistive sensor layer segment and a soft adjacent layer segment.

15. The magnetoresistive sensor of claim 14, wherein all of the plurality of tri-layered segments have substantially equal widths.

16. The magnetoresistive sensor of claim 8, wherein each of the plurality of permanent magnets is formed directly on top of the magnetoresistive sensor layer.

\* \* \* \* \*